(12) United States Patent
Visocchi

(10) Patent No.: US 6,876,260 B2
(45) Date of Patent: Apr. 5, 2005

(54) ELEVATED FRONT-END TRANSIMPEDANCE AMPLIFIER

(75) Inventor: Pasqualino Michele Visocchi, High Barnet (GB)

(73) Assignee: Gennum Corporation, Burlington (CA)

(*) Notice: Subject to any disclaimer, the term of this patent is extended or adjusted under 35 U.S.C. 154(b) by 0 days.

(21) Appl. No.: 10/657,088

(22) Filed: Sep. 9, 2003

(65) Prior Publication Data

US 2005/0052248 A1 Mar. 10, 2005

(51) Int. Cl.[7] ................................................. H03F 3/08
(52) U.S. Cl. ................................... 330/308; 250/214 A
(58) Field of Search ................................ 330/308, 282, 330/292, 293, 284; 250/214 M

(56) References Cited

U.S. PATENT DOCUMENTS

| | | | | |
|---|---|---|---|---|
| 5,216,386 A | * | 6/1993 | Wyatt | 330/308 |
| 5,874,861 A | * | 2/1999 | Nagase et al. | 330/308 |
| 5,952,887 A | * | 9/1999 | Katayanagi et al. | 330/308 |
| 6,297,701 B1 | | 10/2001 | Visocchi et al. | |

* cited by examiner

Primary Examiner—Henry Choe
(74) Attorney, Agent, or Firm—Kenyon & Kenyon

(57) ABSTRACT

Transimpedance amplifiers (TIAs) are typically used within optical receiver modules to amplify weak photocurrents received from the photodetector. The TIA amplifies this weak photocurrent into an output voltage that is further provided to other stages of the optical receiver module. Since TIAs are used to amplify weak photocurrents, noise in the resultant amplification of the weak photocurrent is typically a problem. However, TIAs must not only provide low noise amplification of weak photocurrents, but must also operate when a much higher optical power is received by the photodetector and hence a much higher photocurrent is provided to an input port of the TIA. An elevated front end TIA (EFTIA) is thus provided that offers low noise performance while providing a wide dynamic range, which overcomes the deficiencies of the prior art. Furthermore, the EFTIA is provided absent a transistor switching circuit.

24 Claims, 2 Drawing Sheets

ELEVATED FRONT-END TRANSIMPEDANCE AMPLIFIER

FIELD OF THE INVENTION

The invention relates to the field of amplifiers circuits and more specifically in the field of realizing low noise and wide dynamic range in transimpedance amplifier circuits.

BACKGROUND OF THE INVENTION

The ever increasing demands for high capacity communications systems has resulted in a wide spread deployment of optical fiber networks across the world. A fundamental component used in such systems receives pulses of light and converts these into electrical signals. The pulses of light in such systems comprise a bit stream of information. This fundamental component employed in the fiber optic networks is commonly known as an optical receiver module. Within the optical receiver, a photodetector is typically employed to receive the light pulses and an amplifying circuit is employed for amplifying photocurrent generated within the photodetector.

Transimpedance amplifiers (TIAs) are typically used within optical receiver modules to amplify and transform weak photocurrents received from the photodetector, in the form of a photodiode or a PIN diode. The TIA amplifies and transforms the photocurrent into an output voltage that is further provided to other stages of the optical receiver module. Since TIAs are used to deal with both strong and weak photocurrents, noise in the resultant amplification and transformation to a voltage signal is typically a problem. Indeed, for those skilled in the art of the design of TIAs, it is well understood and appreciated that the noise introduced by the TIA, in many circumstances, limits the ability of the optical receiver module to faithfully reconstruct the intended stream of information. Furthermore, a relationship between the rate at which errors are produced by the receiver—often called the Bit Error Rate (BER), and the noise generated by the TIA can be shown. Thus, the optical receiver module needs to have low noise amplification performed on the weak photocurrents in order to facilitate optical transmission of information. This is especially true in circumstances where the distance that the optical signal must travel is long and results in weak optical pulses at the receiver. It is known to those skilled in the art that long transmission distances—the distance between a transmitter and a receiver—serves to attenuate the initial transmitted optical signal strength and places a greater burden upon the receiver module to avoid errors. Furthermore, it is also known that cost of an optical communication system is reduced if a signal is transmitted along a longer length of optical fiber or, in the alternative, if less optical power is transmitted. Thus, providing low noise amplification for the TIA is important in order to reduce the bit error rate (BER) of the received and amplified signal.

However, TIAs must not only provide low noise amplification of weak photocurrents, but must also operate when a much higher optical power is received by the photodetector and hence a much higher photocurrent is provided to an input port of the TIA. Thus, the TIA must exhibit wide dynamic range operation so that it does not suffer from input photocurrent overload, where the output voltage from the TIA is greatly distorted to the extent that errors occur. For example, if an optical receiver is used with a short transmission length of optical fiber, then the optical signal power levels received by the photodetector and hence the TIA, can be much higher than when the TIA operates with much longer transmission lengths of optical fibre. Of course, with the higher photocurrent received from the photodetector, the TIA must also exhibit acceptable BER performance as with the lower photocurrents.

In practice, in order to achieve a wide dynamic range for TIA operation, some form of switching circuit is typically used, or in some cases, an AGC or limiting function is utilized in order to vary the transimpedance gain of the TIA. In U.S. Pat. No. 6,218,905, entitled "Common-gate transimpedance amplifier with dynamically controlled input impedance," an AGC is utilized in order to vary the gain of the TIA. In U.S. Pat. No. 6,297,701, entitled "Wide dynamic range transimpedance amplifier," an AGC function is realized by a transistor switching network.

The most commonly used photodiode detector is the PIN diode, were the anode is usually connected to the input of the TIA while the cathode is connected to the positive voltage rail. Depending upon the type of PIN diode used, the wavelength of operation and possibly the data rate, the amount of reverse voltage required to allow the PIN diode to operate within its full dynamic range—from maximum sensitivity to overload—can vary between 5V to 0.8V. The reverse bias voltage requirement often dictates the circuit architecture of the front end transimpedance stage, which provides the input bias voltage to the PIN diode. As a result, performance compromises between sensitivity and overload typically occur.

If high optical sensitivity is required from the receiver, the TIA input bias voltage is required to be as low as possible (0.8V), which provides maximum reverse bias voltage, thus the PIN diode exhibits minimum detector capacitance. However, this design approach reduces the overload performance of the TIA. On the other hand, if a higher overload is required, a TIA requires a higher input bias voltage, which in turn reduces the PIN diode reverse bias voltage, increasing the detector capacitance and reducing the optical receiver's sensitivity. The issue is exacerbated if a further requirement is to provide a 3.3V single rail operation, which can often restrict the input bias voltage required to offer both high sensitivity and overload performance from the TIA.

A need therefore exists to provide a high reverse bias voltage required by a PIN diode operating at 1300–1550 nm wavelength and 10 Gbit/s from a 3.3V single supply rail, providing sufficient reverse bias voltage to allow full dynamic range to be achieved without significant compromise in sensitivity and overload performance of the TIA.

It is therefore an object of the invention to provide a TIA that offers wide dynamic range operation without resulting in a significant compromise between sensitivity and overload performance of the TIA.

SUMMARY OF THE INVENTION

In accordance with the invention there is provided a method of elevating a potential of a transimpedance amplifier input port comprising the steps of: providing a long tail pair of transistors including a first transistor having a base terminal coupled with the transimpedance amplifier input port and a second transistor having a base terminal for receiving a first bias voltage, the emitter terminals of both transistors coupled to an AC ground terminal; providing the first bias voltage to the base terminal of the second transistor; and, shifting a DC saturation voltage of the first transistor by providing an approximately equal DC voltage to the transimpedance amplifier input port as the DC voltage provided to the base terminal of the second transistor.

In accordance with the invention there is provided a method of increasing a reverse bias voltage for a PIN diode having an anode terminal coupled to an transimpedance amplifier input port of a transimpedance amplifier and having a cathode terminal coupled to a positive supply voltage input port having a first DC potential comprising the steps of: providing a long tail pair of transistors including a first transistor having a base terminal coupled the transimpedance amplifier input port and a second transistor; providing a DC bias voltage having a value equal to the first DC potential minus a second DC potential to the base terminal of the second transistor resulting in the first transistor having a base terminal DC potential approximately equal to that of the first DC potential minus the second DC potential; and, reverse biasing the PIN diode with the second DC potential.

In accordance with the invention there is provided an elevated front-end transimpedance amplifier comprising: a first supply voltage input port for receiving a first DC potential; a second supply voltage input port for receiving a second DC potential that is lower than that of the first DC potential; an input stage comprising a long tail pair of transistors comprising a first transistor having a base terminal coupled with a transimpedance amplifier input port and a second transistor having a base terminal for receiving a first DC bias voltage, one of the emitter and collector terminals of first and second transistors coupled together and the other of the terminals for receiving at least a portion of the first DC potential; an input stage bias port coupled to the base terminal of the second transistor for receiving an input stage DC bias voltage; and, a first current source for shifting a DC saturation voltage of the first transistor by providing an approximately equal DC voltage on the transimpedance amplifier input port as the first DC bias voltage provided to the base terminal of the second transistor.

BRIEF DESCRIPTION OF THE DRAWINGS

Exemplary embodiments of the invention will now be described in conjunction with the following drawings, in which.

DETAILED DESCRIPTION OF THE INVENTION

Figure 1:
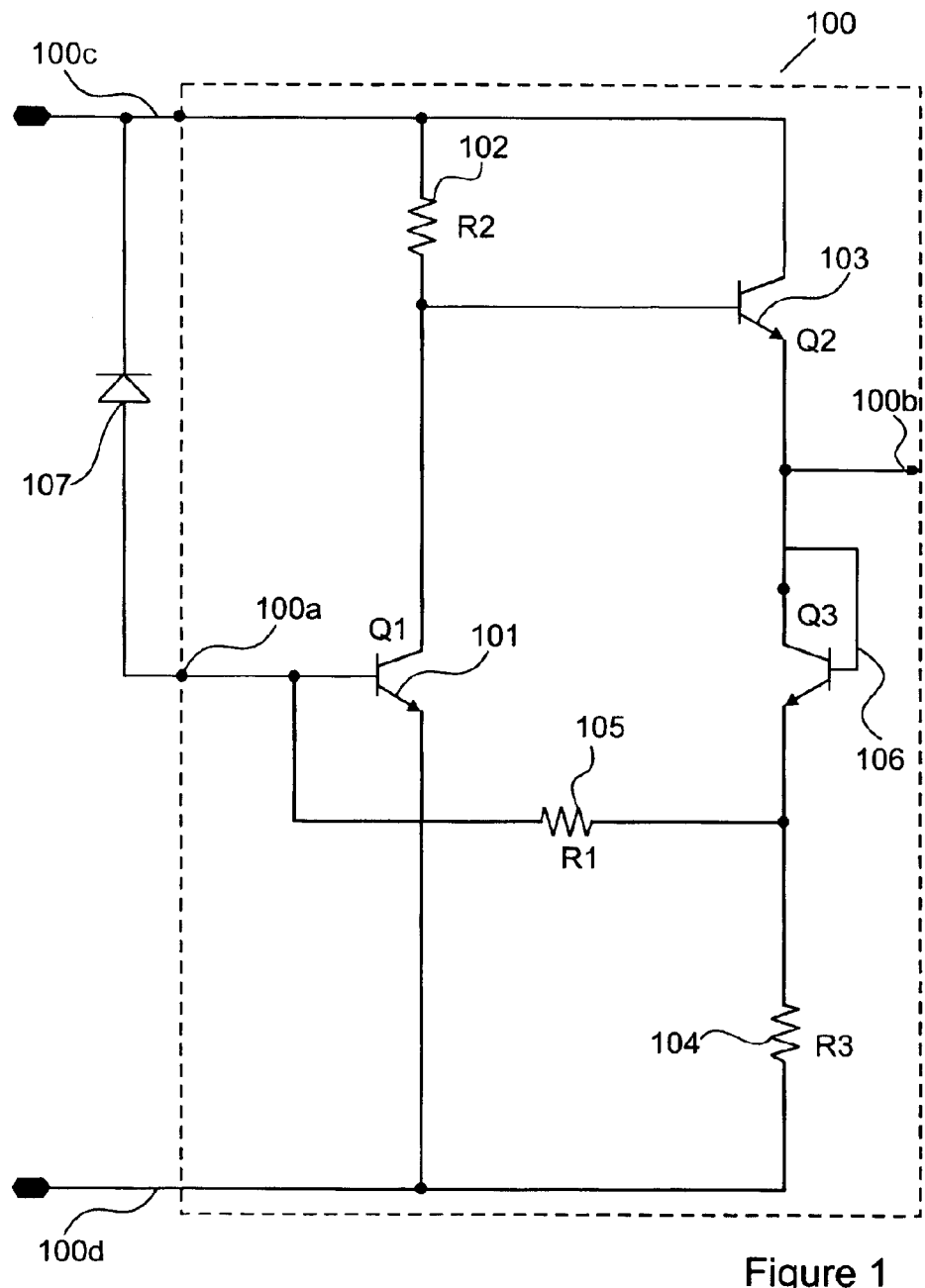
FIG. 1 illustrates a prior art common emitter transimpedance amplifier (TIA) that uses a fixed input port bias voltage; and, FIG. 2 illustrates an elevated front end TIA (EFTIA) in accordance with an embodiment of the invention.

FIG. 1 illustrates a commonly used first stage TIA 100 arranged in a common emitter configuration. An emitter port of the input transistor Q1 101 is connected to ground and a collector port of transistor Q1 101 is connected in series with a load resistor R2 102 to a positive voltage supply input port 100c. A base port 100a of the input transistor 101 is connected to receive current for amplification, such as photocurrent from a photodiode, in the form of a PIN diode 107 having its anode coupled to an input port 100a and its cathode coupled to the positive voltage supply input port 100c. In this typical configuration, the base port of the input transistor Q1 101 has a potential of one Vbe above ground and thus has an approximate voltage potential of 0.8V. The collector port of the input transistor Q1 101 is optionally connected to cascode transistors (not shown) or to a load resistor R2 102. Transistor Q2 103 and resistor R3 104 provide an emitter follower circuit in combination with a feedback resistor R1 105. The emitter of transistor Q2 103 is used to provide a closed loop path in combination with a feedback resistor R1 105 to form a shunt feedback circuit for shunting of an output signal of the TIA 100. This shunt feedback circuit is used to set the gain of the TIA 100. Transistor Q3 106, disposed in a diode configuration, is used to provide a DC level shift in the output signal provided from the TIA output port 100b. This DC level shift facilitates the connection of the first stage TIA 100 to a subsequent signal processing stage (not shown) connected thereto.

Connecting the emitter port of the input transistor Q1 101 directly to ground allows for a maximum open loop gain to be provided by the first stage TIA 100. This connection allows for the use of a high value feedback resistance R1 105 and offers reduced input signal noise. Unfortunately, although the common emitter configuration shown in FIG. 1 is often used to provide a low noise TIA 100, this low noise performance is achieved at the expense of high overload performance. The base voltage of input transistor Q1 101 determines the voltage drop across R3 104. Assuming that negligible base current is flowing in the input transistor Q1 101, the voltage drop across R3 104 is approximately 0.8V, which is the Vbe of the input transistor Q1 101. Unfortunately, this voltage drop restricts the amount of voltage swing at the emitter port of output transistor Q2 103 and thus restricts the amount of voltage swing at the TIA output port 100b. Of course, reducing the value of the feedback resistor R1 105 reduces the voltage swing at the output port 100b, but the resulting decrease in gain results in increased output signal noise. In addition, a maximum reverse voltage for the PIN diode 107 of 2.5V is provided, for a positive supply voltage of 3.3V, which reduces the PIN diode 107 capacitance.

Figure 2:
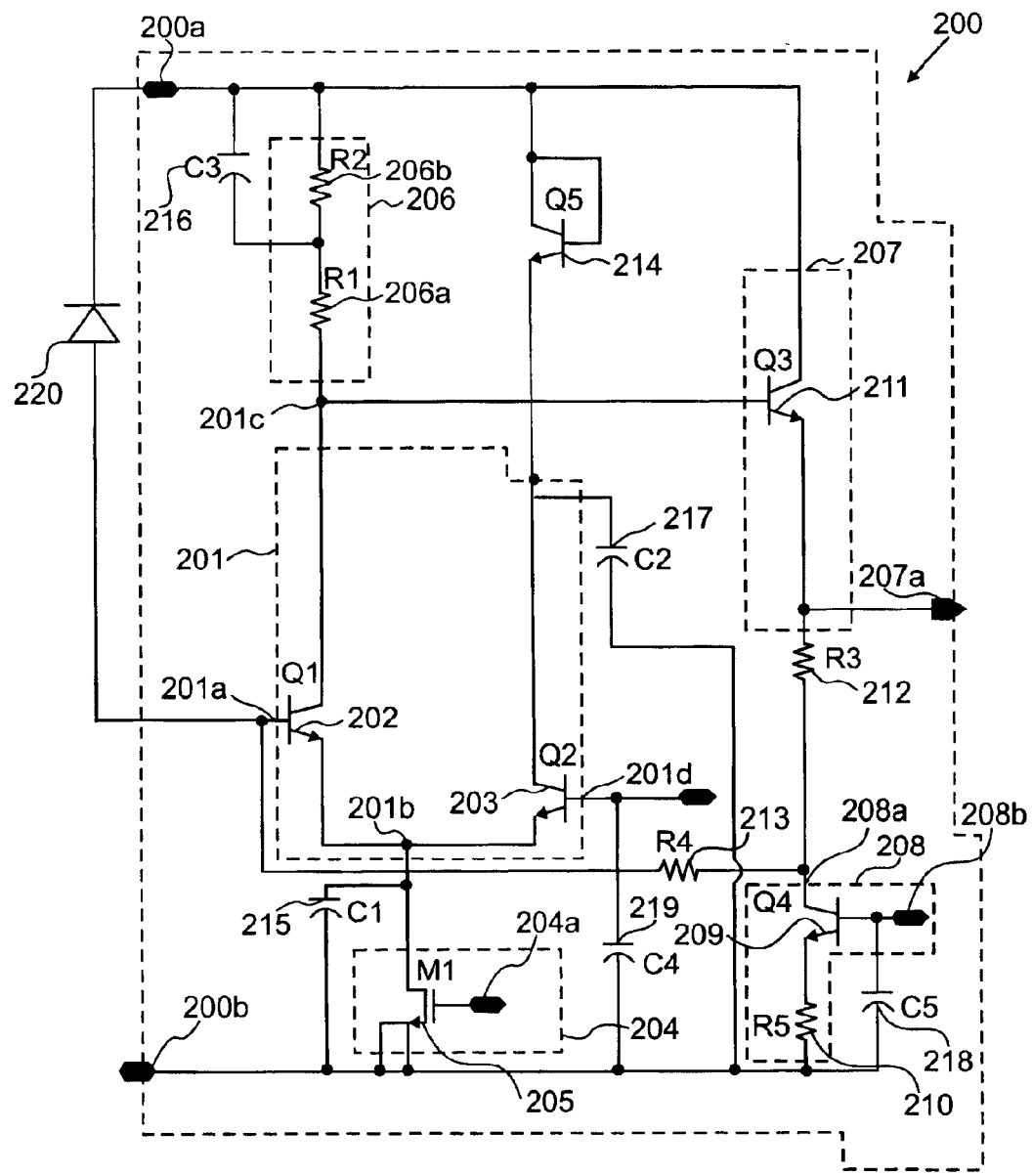

Referring to FIG. 2, an elevated front-end TIA (EFTIA) 200 in accordance with an embodiment of the invention is shown. The EFTIA 200 is preferably formed in an integrated semiconductor substrate using a BiCMOS process. Furthermore, the EFTIA 200 is preferably intended to operate for receiving photocurrent from a photodiode 220 for receiving optical signal having data rates that are in the order of 10 Gbit/s. Electrical power is provided to the EFTIA using a first supply voltage input port 200a for receiving a first voltage supply and a second supply voltage input port 200b coupled to a second voltage supply. Preferably the second voltage supply is at a ground potential and the first voltage supply is at a positive potential.

For the EFTIA, an input stage 201 is provided that includes an input transistor Q1 202 having its base terminal coupled to an EFTIA input port 201a. The photodiode 220 preferably has its anode coupled to the EFTIA input port 201a, a base terminal of the input transistor 202, and its cathode coupled to the first supply voltage input port 200a. The input transistor Q1 202 and a second transistor Q2 203 form a long tail transistor pair with emitter terminals from both transistors Q1 202 and Q2 203 connected to an input stage current input port 201b for receiving a first current (I1) from a first current source 204. The first current source 204 includes MOSFET M1 205, where the first current I1 is provide from the drain terminal of MOSFET M1 205 to the input stage current input port 201b. A second bias input port 204a is disposed on the first current source 204 for receiving of a second bias voltage (VbiasCStail) provided thereto from a second bias source (not shown) for use in determining a magnitude of the first current I1 emitted therefrom. An input stage bias port 201d is additionally disposed on the input stage 201 for receiving a first bias voltage (Vbias) from a first bias source (not shown) for biasing of the input transistor Q1 202 and second transistor Q2 203. The first bias voltage is for biasing of transistor Q1 202 in such a manner that it is useable with a plurality of different types of photodetectors (not shown) for receiving different ranges of photocurrent therefrom. Preferably the first bias voltage is a DC bias voltage. A first stage output port 201c, at the collector terminal of transistor Q1 202, is for coupling an output signal provided by the input stage 201 to an output stage 207 of the EFTIA 200. A resistor network 206, including a resistor R1 206a and a resistor R2 206b in series, is provided for determining an output signal level of the output signal provided by the input stage 201 to the output stage 207. The resistor network 206 is connected with a first end to the first supply voltage input port 200a, for receiving a preferably positive input voltage (Vpos), and with a second end to the collector terminal of the input transistor Q1 202. The collector port of the second transistor Q2 203 is connected to an emitter terminal of a transistor Q5 214 disposed in a diode configuration, with the collector terminal of transistor Q5 214 configuration connected to the first supply voltage input port 200a.

A second current source 208 is used to provide a portion of a second current (I2) to an emitter follower circuit of transistor Q3 211 forming the output stage 207. The second current source 208 is formed from transistor Q4 209 and resistor R5 210. The base terminal of transistor Q3 211 is coupled to the first stage output port 201c for receiving the output signal provided by the input stage 201. A collector terminal of transistor Q3 211 is coupled to the first supply voltage input port 200a and an emitter port of transistor Q3 211 is coupled to the output stage output port 207a forming an EFTIA output port. An output resistor R3 212 is connected at a first end to the output stage output port 207a and at a second end to the second current source output port 208a for propagating a portion of current I2 therethrough. This output resistor R3 212 is used to provide a constant voltage drop (V3), having a value of V3=I2R3, to an amplified signal emitted from the output stage output port 207a. This voltage drop realized across resistor R3 212 is used to determine a DC bias voltage provided to the EFTIA output port 207a to facilitate coupling of the EFTIA output port 207a to subsequent signal processing stages (not shown).

A feedback resistor R4 213 is connected between the EFTIA input port 201a the second current source output port 208a, where more specifically this feedback resistor R4 213 is coupled between the base terminal of input transistor Q1 202 and the collector terminal of transistor Q4 209. The feedback resistor R4 213 is used to provide a shunt feedback path for propagating a portion of the second current I2, in the form of a feedback signal, from the second current source to the EFTIA input port 201a. The shunt feedback path forms a closed circuit loop between the EFTIA input port 201a and the second current source output port 208a for propagating of the feedback signal. A third bias port 208b is disposed on the second current source 208 for receiving a third bias voltage (VbiasCSef) from a third bias source (not shown) used in determining an amount of current I2 to be provided from the second current source 208. The second current I2 from the second current source is used to provide the feedback signal to the EFTIA input port 201a as well as to DC bias the output port to facilitate coupling of the EFTIA output port 207a subsequent signal processing stages (not shown). A fourth capacitor C4 219 is disposed between the input stage bias port 201d and the second supply voltage input port 200b Equation [1] determines the collector current of transistor Q1 202 of the input stage 201:

$$I_{C\_Q1}=(Vpos-Vbias-I2R3-Vbe)/(R1+R2) \quad [1]$$

This collector current for transistor Q1 202 is determined by varying Vbias applied to the input stage bias port 201d and of the resistor values of resistors R1 206a and R2 206b in the resistor network 206 in order to provide low noise EFTIA 200 operation as well as high open loop gain. The collector current of the second transistor Q2 203 is determined by equation [2]:

$$I_{C\_Q2}=I1-(Vpos-Vbias-I2R3-Vbe)/(R1+R2) \quad [2]$$

The choices for Vbias and the values for resistors R1 206a and R2 206b in the resistor network 206 are chosen such that:

$$I1-(Vpos-Vbias-I2R3-Vbe)/(R1+R2)>>(Vpos-Vbias-I2R3-Vbe)/(R1+R2) \quad [3]$$

Equation [3] assures that for operation of the EFTIA 200 at low frequencies, the emitter terminal of the second transistor Q2 203 appears as low impedance that terminates at a base capacitance of:

$$C4h_{FE\_Q2}, \quad [4]$$

or the capacitance value of capacitor C4 219 times the AC current gain of transistor Q2 203. However, at high frequencies, the emitter port of transistor Q2 203 begins to appear as high impedance, because it is inductive, and therefore a shunt capacitance C1 215 provides a low impedance path to the second supply voltage input port 200b for these high frequencies. This low impedance path provides for the low noise EFTIA performance and high open loop gain. A third capacitor C3 216, in the form of a zero pole compensation capacitor, is disposed in parallel across a portion of the resistor network 206 in order to provide zero pole compensation for the EFTIA 200 and to aid in its closed loop stability when in use. Transistor Q5 214, disposed to function solely as a diode, is used for limiting the Vce voltage of transistor Q2 203 for EFTIA operation. A second capacitor C2 disposed between the collector terminal of transistor Q2 203 and the second supply voltage input port 200b is used to limit noise within the EFTIA, when in use. A fifth capacitor C5 218 disposed in parallel with the third bias port 208b of the second current source 208 and the second supply voltage input port 200b, also for limiting noise within the EFTIA, when in use.

For a standard (prior art) common emitter front-end transimpedance amplifier, such as that shown in FIG. 1, the emitter of the transistor Q1 101 is typically connected to the negative voltage input (Vneg), or ground. However, in this configuration a voltage potential on the input port for receiving the photocurrent from the photodiode 220 is typically 0.8V, or one Vbe, above ground. Thus, when voltages resulting from photocurrents generated by the photodetector exceed a swing of 0.8V, then the TIA overloads and does not provide a proper amplified representation of the input photocurrent. This improper representation of the input photocurrent potential leads to high BER in the received and amplified signal when the TIA 100 is used in a telecommunications signal receiver.

The significant advantage of the embodiment of the invention 200, shown in FIG. 2, over a common emitter type TIA front-end 100 is that the EFTIA 200 input port 201a is biased at such a predetermined voltage that it is preferably greater than one 0.8V, and thus overload performance of the EFTIA 200 is advantageously improved. Advantageously, by providing low AC input impedance at the emitter port of the input transistor Q1 202, low noise performance is preferably achieved. Furthermore, by selectively biasing of the input port 201a advantageously the dynamic range of the EFTIA is increased.

Numerous other embodiments may be envisaged without departing from the spirit or scope of the invention.

What is claimed is:

1. A method of elevating a potential of a transimpedance amplifier input port comprising the steps of:
providing a long tail pair of transistors including a first transistor having a base terminal coupled with the transimpedance amplifier input port and a second transistor having a base terminal for receiving a first bias voltage, the emitter terminals of both transistors coupled to an AC ground terminal;
providing the first bias voltage to the base terminal of the second transistor; and,
shifting a DC saturation voltage of the first transistor by providing an approximately equal DC voltage to the transimpedance amplifier input port as the DC voltage provided to the base terminal of the second transistor.

2. A method according to claim 1, wherein the step of shifting the saturation voltage comprises the steps of:
providing a first current source for providing a first current to the emitter terminals of the long tail pair of transistors; and,
biasing the emitter terminals at a first predetermined bias voltage using the fist current.

3. A method according to claim 1, wherein the step of shifting the saturation voltage comprises the steps of:
providing an emitter follower circuit connected to one of the emitter and collector terminals of one of the transistors forming the long tail pair;
providing a second current source for providing a second current the emitter follower circuit in dependence upon a bias signal received on a bias port thereof.

4. A method according to claim 1, comprising the steps of:
providing a first supply voltage input port with a potential of approximately 3.3V; and,
providing a second supply voltage input port with a ground potential, where a bias voltage of the transimpedance amplifier input port is approximately 1.5V above a potential of the AC ground terminal.

5. A method according to claim 1, wherein a saturation voltage of the first transistor is greater than 0.8V.

6. A method of increasing a reverse bias voltage for a PIN diode having an anode terminal coupled to an transimpedance amplifier input port of a transimpedance amplifier and having a cathode terminal coupled to a positive supply voltage input port having a first DC potential comprising the steps of:
providing a long tail pair of transistors including a first transistor having a base terminal coupled the transimpedance amplifier input port and a second transistor;
providing a DC bias voltage having a value equal to the first DC potential minus a second DC potential to the base terminal of the second transistor resulting in the first transistor having a base terminal DC potential approximately equal to that of the first DC potential minus the second DC potential; and,
reverse biasing the PIN diode with the second DC potential.

7. A method according to claim 6, wherein the first DC potential minus the second DC potential has a resultant potential that is greater than 0.7V.

8. A method according to claim 6, wherein the first DC potential is approximately 3.3V and the first DC potential minus the second DC potential has a resultant potential of approximately 1.5V.

9. An elevated front-end transimpedance amplifier comprising:
a first supply voltage input port for receiving a first DC potential;
a second supply voltage input port for receiving a second DC potential that is lower than that of the first DC potential;
an input stage comprising a long tail pair of transistors comprising a first transistor having a base terminal coupled with a transimpedance amplifier input port and a second transistor having a base terminal for receiving a first DC bias voltage, one of the emitter and collector terminals of first and second transistors coupled together and the other of the terminals for receiving at least a portion of the first DC potential;
an input stage bias port coupled to the base terminal of the second transistor for receiving an input stage DC bias voltage; and,
a first current source for shifting a DC saturation voltage of the first transistor by providing an approximately equal DC voltage on the transimpedance amplifier input port as the first DC bias voltage provided to the base terminal of the second transistor.

10. An elevated front-end transimpedance amplifier according to claim 9, wherein the first current source is for providing a first current from a first current output port to one of the emitter and collector terminals of first and second transistors forming the long tail pair.

11. An elevated front-end transimpedance amplifier according to claim 10, wherein the first transistor has one of the emitter terminal and collector terminal coupled to an input stage output port and the other terminal is coupled to the first current source for receiving the first current therefrom.

12. An elevated front-end transimpedance amplifier circuit (EFTIA) according to claim 9, comprising a diode, where one of the emitter terminal and collector terminals of the second transistor are connected thru the diode to the first supply voltage input port.

13. An elevated front-end transimpedance amplifier circuit (EFTIA) according to claim 10, comprising an output stage comprising a third transistor, the third transistor having a base terminal coupled to the input stage output port and one of the emitter terminal and the collector terminal coupled to a transimpedance amplifier output port and the other terminal coupled to the first supply voltage input port.

14. An elevated front-end transimpedance amplifier circuit (EFTIA) according to claim 13, comprising:
a second current source having a second current source output port; and,
an output resistor, the output resistor coupled in series between the second current source output port and the EFTIA output port.

15. An elevated front-end transimpedance amplifier circuit (EFTIA) according to claim 10, comprising a feedback resistor, the feedback resistor connected between the second current source output port and the transimpedance amplifier input port for propagating the feedback signal to the transimpedance amplifier input port for determining a gain of the EFTIA.

16. An elevated front-end transimpedance amplifier circuit (EFTIA) according to claim 13, comprising a resistor network, the resistor network coupled in series between the first supply voltage input port and the input stage output port for determining an output signal level provided from the input stage output port to the output stage input port.

17. An elevated front-end transimpedance amplifier circuit (EFTIA) according to claim 16, comprising a third capacitor disposed in parallel with a portion of the resistor network for providing zero pole compensation to the EFTIA, when the EFTIA is in use.

18. An elevated front-end transimpedance amplifier circuit (EFTIA) according to claim 9, comprising a first capacitor disposed between the second supply voltage input port and the second current source output port for providing a low impedance path to the second supply voltage input port for high frequency input signals received from the long tail pair of transistors.

19. An elevated front-end transimpedance amplifier circuit (EFTIA) according to claim 9, comprising a second capacitor disposed between one of emitter and collector terminals of the second transistor and the second supply voltage input port, the second capacitor for limiting noise in the EFTIA, when the EFTIA is in use.

20. An elevated front-end transimpedance amplifier circuit (EFTIA) according to claim 9, comprising a fourth capacitor disposed between the input stage bias port and the second supply voltage input port. {Steve} O.K. this is C4.

21. An elevated front-end transimpedance amplifier circuit (EFTIA) according to claim 10, comprising a fifth capacitor in parallel with a portion of the second current source for limiting noise in the EFTIA, when in use.

22. An elevated front-end transimpedance amplifier circuit (EFTIA) according to claim 10, wherein the first current source comprises a MOS transistor.

23. An elevated front-end transimpedance amplifier circuit (EFTIA) according to claim 10, wherein the second current source comprises a transistor in series with a resistor.

24. An elevated front-end transimpedance amplifier circuit (EFTIA) according to claim 9, wherein the EFTIA is fully integrated on an integrated semiconductor substrate using a BiCMOS process.

* * * * *